United States Patent
Tchamov et al.

[11] Patent Number: 5,936,475
[45] Date of Patent: Aug. 10, 1999

[54] HIGH-SPEED RING OSCILLATOR

[76] Inventors: Nikolay Tchamov, Lindforsinkatu 21 A 17, Fin-33720 Tampere; Petri Jarske, Pirilänkuja 8, FIN-34240 Kämmenniemi, both of Finland

[21] Appl. No.: 08/873,309

[22] Filed: Jun. 11, 1997

[30] Foreign Application Priority Data

Jun. 11, 1996 [FI] Finland .................................. 962419

[51] Int. Cl.[6] .................................................. H03B 5/00
[52] U.S. Cl. .............................. 331/57; 331/45; 327/266; 327/268; 327/287; 327/290; 327/274; 330/252
[58] Field of Search ...................................... 327/238, 563, 327/266, 560, 274, 268, 287, 290, 246, 252, 283; 331/57, 117 R, 42, 45; 330/254, 252

[56] References Cited

U.S. PATENT DOCUMENTS

| | | | |
|---|---|---|---|
| 4,592,087 | 5/1986 | Killion .................................. 330/251 X |
| 5,140,286 | 8/1992 | Black et al. ............................... 331/99 |
| 5,343,162 | 8/1994 | Davis ........................................ 330/252 |
| 5,418,497 | 5/1995 | Martin ........................................ 331/48 |
| 5,561,398 | 10/1996 | Rasmussen ............................. 331/36 C |
| 5,561,399 | 10/1996 | Haartsen .................................... 331/57 |
| 5,602,508 | 2/1997 | Endou et al. ............................ 330/252 |

FOREIGN PATENT DOCUMENTS

WO 85/00941  2/1985  WIPO.
WO 94/01927  1/1994  WIPO.

OTHER PUBLICATIONS

Razavi, B., *IEEE J. of Solid–State Circuits*, vol. 29, No. 12, pp. 1560–1565 (Dec. 1994).
Buchwald, A.W. et al., *Electronics Letters*, vol. 27, No. 4, pp. 309–310 (Feb. 14, 1991).

*Primary Examiner*—Arnold Kinkead
*Attorney, Agent, or Firm*—Scully, Scott, Murphy & Presser

[57] ABSTRACT

A ring oscillator comprising a cascade connection of two or several delay stages (31 to 33), wherein each delay stage comprises two differential pairs of two transistors (Q1, Q2; Q3, Q4; Q5, Q7). In the ring oscillator, the collector resistors and the emitter resistor of a traditional ring oscillator are replaced by coils (L1 to L6) in all stages.

12 Claims, 4 Drawing Sheets

HIGH-SPEED RING OSCILLATOR

FIELD OF THE INVENTION

The invention relates generally to oscillator circuits, i.e. oscillators, and more specifically to ring oscillators.

BACKGROUND OF THE INVENTION

Current and voltage controlled oscillators (ICO and VCO) are important components in the structures of transmitters and receivers. When applications in portable wireless communications systems are concerned, the main requirements for VCO/ICOs are: an operational frequency range of 1 to 20 GHz, a very low phase noise, and the lowest possible operating voltage and power consumption. Depending on the structure, a communications device may comprise several VCO/ICOs needed for different purposes, e.g. frequency conversion, synthetization, modulation, etc. Their performance affects strongly the performance of the entire communications unit. However, the demand to implement these oscillators for silicon technologies faces several problems.

During the last few years several research projects have focused on finding optimal solutions. Two types of oscillators are mainly used as the cores of VCO/ICOs: sinusoidal oscillators and relaxation oscillators. Sinusoidal oscillators usually produce the best parameters as far as high frequency and low phase noise are concerned, but they can be easily implemented mostly on GaAS technologies only. A transition to bipolar, CMOS or BiCMOS technologies causes several problems mainly due to the highly conductive substrate. On the other hand, the speed of such available technologies is a challenge to researchers, as at present transient frequencies of 10 to 40 GHz are reached, which was previously considered to be a transient range possible to be covered only by materials based on GaAS. The speed of silicon-based technologies is sufficient enough for mobile communication in the frequency range of 1 to 20 GHz, used by most mobile stations and wireless LANs. An additional driving factor in the design of portable equipment has always been a high demand for as low an operating voltage as possible and a very low power consumption.

In oscillators of LC type, the active circuit components are kept out of the non-linear operation range, whereas in relaxation oscillators, the sinusoidal signal is the result of the incapability of the pulse circuit to switch fast enough at very high frequencies.

Due to the operation in the non-linear operation range, many high-energy spectral components occur in the output signal. A very 'clean' spectrum can thus be obtained by developing oscillators of LC type. While the relaxation types only need a reference capacitance, the LC types require, in addition to a contour capacitance, also an inductance having a reasonably high Q factor. This causes technological difficulties.

Ring oscillators are a subclass of relaxation oscillators. A ring oscillator comprises several (typically at least three) differential delay stages in cascade, such as stages A1, A2, A3 and A4 in FIG. 1. In cascade, the noninverted output of a delay element of each stage A1 to A3 is connected to the non-inverting input of the next stage and the inverted output to the inverting input. The outputs of the last stage are connected to the inputs of the first stage in the same way as in the other stages or, as in FIG. 1, the inverted output of the last stage A4 is connected to the non-inverting input of the first stage A1 and the non-inverted output to the inverting input, respectively. An oscillation period of a ring oscillator is twice the number of delays (stages).

The delay stages of a ring oscillator usually are differential amplifiers implemented as a differential pair, as shown in FIG. 2. The collectors of NPN transistors Q1 and Q2 are connected via resistors Rc to one potential of an operating voltage source. The emitters of Q1 and Q2 are in turn connected via a current source 21 and a resistor Re to another operating voltage potential. The bases of Q1 and Q2 provide stage inputs and the collectors provide stage outputs. The differential stages are usually joined together via coupling buffers, such as emitter followers. Further, the outputs of a differential stage are applied to active mixers 11, 12 and 13 to be mixed together and with the outputs of the other stages so that a desired quadrature output is produced from the ring oscillator. Ring oscillators are described e.g. in the following publications:

[1] B. Razavi and J. Sung, "A 6 GHz 60 mW BiCMOS Phase-Locked Loop", IEEE Journal of Solid-State Circuits, Vol. 29, No. 12, December 1994, pages 1560 to 1565;

[2] "High-speed voltage-controlled oscillator with quadrature outputs", Electronic Letters, 14th Feb. 1991, Vol. 27, No. 4, page 309.

Voltage and current controlled ring oscillators with quadrature outputs (90 degree phase difference between the outputs) are very important building blocks for many high-speed applications. Such applications are e.g. Phase-Locked Loops (PLL), Binary-Phase-Shift-Keyed (BPSK) demodulators, discriminators, clock recovery circuits for wireless and optic receivers.

The primary parameter to be reached is the maximum frequency. So far, nearly $f_{MAX}$ (the highest frequency set by the manufacturing process of transistors) has been reached by using oscillators of "lumped" resonator type, which are difficult to implement even by a manufacturing process of gallium-arsenic (GaAs) type. Solutions of other types, even if they are fast, have certain difficulties to reach close to the $f_{MAX}$ value of the manufacturing process.

Implementation of a voltage or current controlled ring oscillator requires an addition of a suitable control solution to the circuit. Frequency control usually changes either the DC biasing of certain components or alternatively the reference currents, which affect the timing of relaxation, and the frequency generated through that.

Other requirements of oscillators are e.g. low power consumption and low operating voltage, especially in portable electronic devices using battery power supplies.

SUMMARY OF THE INVENTION

An object of the present invention is a high-speed ring oscillator.

Another object of the invention is a ring oscillator having a low power consumption and/or a low operating voltage.

The invention relates to a ring oscillator comprising a cascade connection of two or several delay stages, each delay stage comprising a differential pair of a first and a second amplifier component. The invention is characterized in that each differential pair comprises a first inductive component, via which a first main electrode of the first amplifier component is connected to a first operating voltage potential, a second inductive component, via which a first main electrode of the second amplifier component is connected to the first operating voltage potential, and a series connection of a third inductive component and a current source between interconnected second main electrodes of the first and second amplifier component and a second operating voltage potential.

In the ring oscillator according to the present invention, inductive components are used instead of ohmic resistances in two important places of each differential pair. To be more precise, the collector resistors and the emitter resistor of a traditional ring oscillator have been replaced by inductive components in all stages. The result is a very simple circuit having excellent properties.

In fact, the result is a ring of resonance amplifier stages, which ring has, due to the low Q factor of the inductive components, a sufficiently broad bandwidth for the requirements of voltage or current controlled oscillators, but which differs from the traditional ring oscillators by having much less phase noise and a spectrum resembling the typical spectrum of sinusoidal oscillators.

If the ring oscillator according to the invention is looked at in more detail, the inductive components at the collector create parallel resonance circuits with their own parasitic capacitances and with the capacitances of the adjacent components, especially with those of the amplifier components (transistors, for instance).

By the approach according to the invention, at least the following significant advantages are achieved:

1. The speed and amplification of each stage is much higher. In traditional ring oscillators, the frequency control is based on delay-causing elements between the stages. In the invention, the frequency control can be carried out by biasing the amplifier stages, and no delay elements are needed, which makes a higher speed possible.

2. The amplitude of the signal is twice higher.

3. Interstage coupling buffers used in traditional ring oscillators are not needed and the total speed of the ring oscillator is the highest possible.

4. Since the amplifiers are resonance amplifiers, non-interesting frequencies (i.e. frequencies outside the resonance band) are hardly amplified at all. This also "equalizes" the output signal closer to the resonance sinusoid of the circuit.

5. Ohmic resistances in collector and emitter branches are now much smaller and belong to the volume resistance of the inductive components and the amplifier components. Due to this, the DC voltage is much lower than in any traditional RC ring oscillator, and therefore, the voltage of the power supply can be dropped very significantly, for instance to 1.2 V. Thanks to the resonance amplifiers, the amplification is high at the resonance frequency.

6. Thanks to the inductive components in series, the performance of the current sources (usually current mirrors) is not so important any longer for the Common-Mode Rejection Ratio (CMRR) and thus for the common-mode rejection. Due to this, the voltage acting across them, as well as the operating voltage of the ring oscillator, can be minimised.

7. Using inductive components with low Q factors permits a broad frequency control range, contrary to using inductive components with high Q factors.

8. The inductive components of the collector branches can be implemented as one coil provided with a tap. Traditional active mixers can be replaced by passive mixers by taking signals from the inductive components of the collector by means of a transformer. Diodes of active mixers, schottky diodes or not, usually have an operating frequency higher than the maximum frequency $f_{MAX}$ of the manufacturing process, defined e.g. for NPN transistors. The output amplitude is lower than the amplitude of the ring, but the frequency is higher than $f_{MAX}$. Theoretically, when three differential amplifier stages are used, a frequency can be reached which is three times the $f_{MAX}$ of the manufacturing process.

BRIEF DESCRIPTION OF THE DRAWINGS

In the following, the invention is described in more detail by means of preferred embodiments referring to the attached drawings, in which.

PREFERRED EMBODIMENTS OF THE INVENTION

Figure 1:
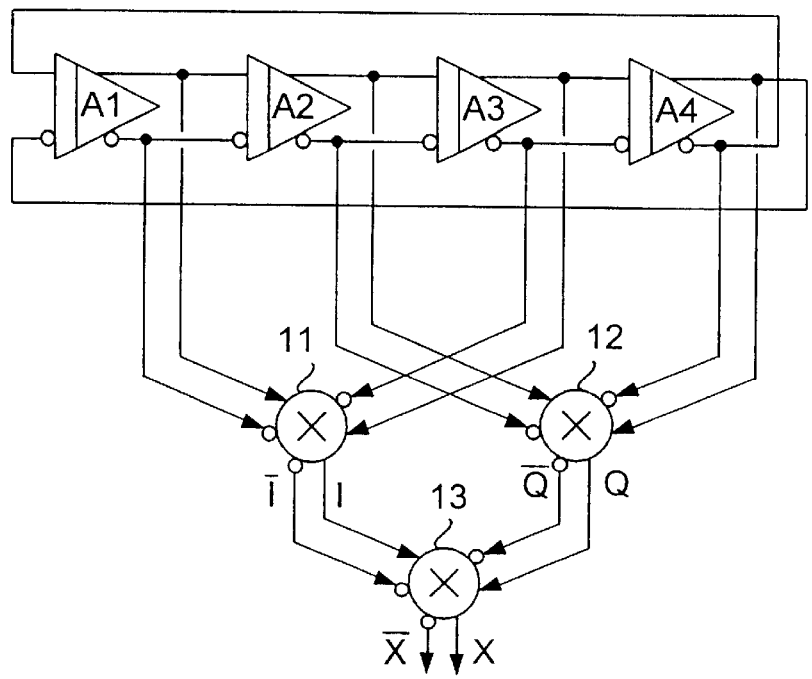
FIG. 1 shows the structure of a ring oscillator in principle.
Figure 2:
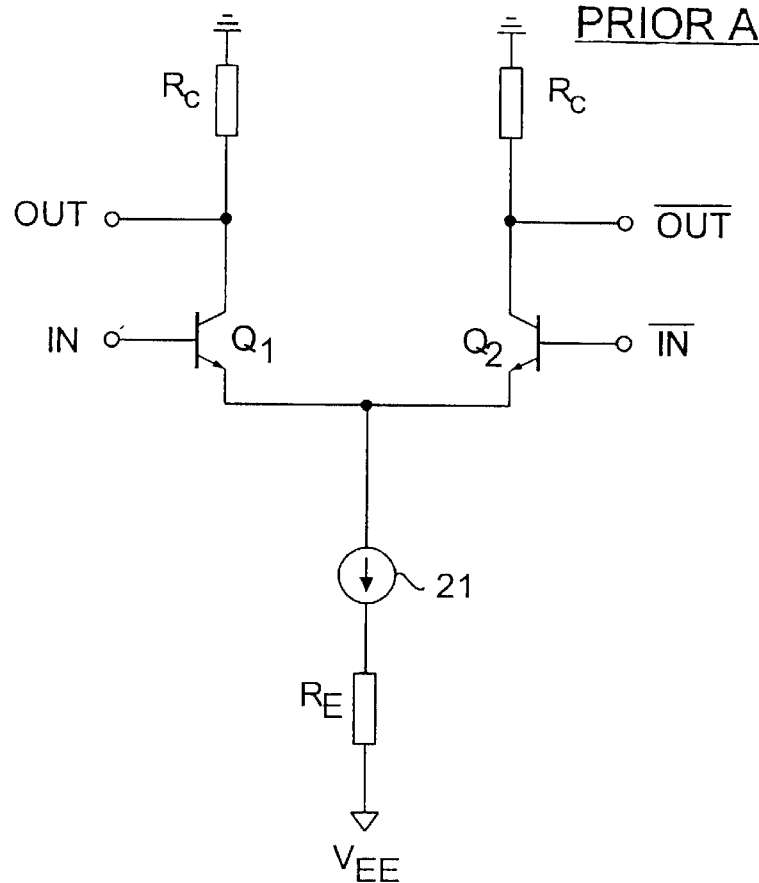
FIG. 2 shows a circuit diagram of a delay element according to the prior art.

The present invention is applicable to lowering operating voltage and increasing speed in most ring oscillator types. Although the ring oscillator according to the prior art shown in FIG. 2 as well as the ring oscillators according to the invention shown in FIGS. 3 and 4 use bipolar transistors as amplifier means, any type of non-linear amplifier components, such as MOS, CMOS, SOI, HEMT and HBT transistors, microwave tubes and vacuum tubes, can in principle be used in the circuit solutions of the invention. The names of the electrodes may vary in these components. The main electrodes of a bipolar transistor are a collector and an emitter and the control electrode constitutes a base. In FET transistors, the corresponding electrodes are a drain, a source and a gate. In vacuum tubes, these electrodes are usually called an anode, a cathode and a gate. The terms emitter, collector and base shall thus be understood in this connection as more general concepts, covering the electrodes of other types of amplifier components as well.

Figure 3:
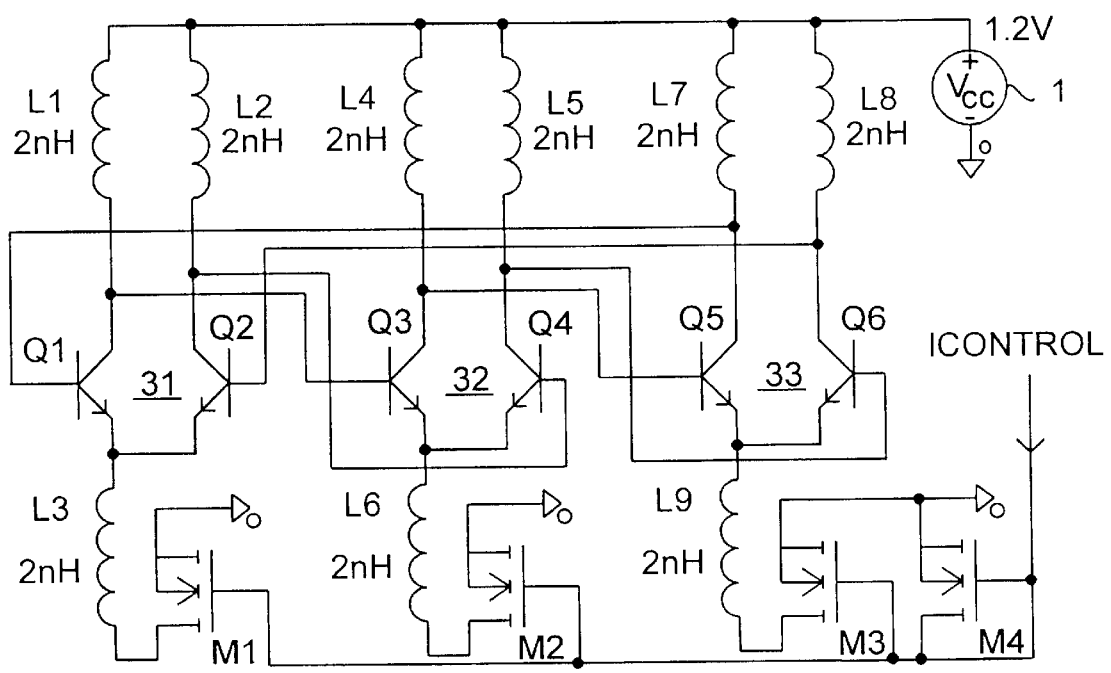
FIG. 3 shows a circuit diagram of a 3-stage ring oscillator according to the invention.

FIG. 3 shows a ring oscillator according to the invention, comprising three differential amplifier stages 31, 32 and 33. The first differential amplifier stage 31 comprises a differential pair of transistors Q1 and Q2. The collector of the transistor Q1 is connected via a coil L1 to a 1.2 V operating voltage Vcc obtained from a voltage source 1. Correspondingly, the collector of the transistor Q2 is connected via a coil L2 to Vcc. The emitters of the transistors Q1 and Q2 are connected together and via a series connection of a coil L3 and a MOS transistor M1 to a potential 0V.

The collectors of transistors Q3 and Q4 of the differential amplifier stage 32 are connected via coils L4 and L5, respectively, to the operating voltage Vcc. The emitters of the transistors Q3 and Q4 are connected together and via a series connection of a coil L6 and a MOS transistor M2 to the potential 0V. The collectors of transistors Q5 and Q6 are connected via coils L7 and L8, respectively, to the operating voltage Vcc. The emitters of the transistors Q5 and Q6 are connected together and via a coil L9 and a MOS transistor M3 to the potential 0V.

The amplifier stages 31, 32 and 33 are cascade-connected to form a ring as follows. The base electrode of the transistor Q1 is connected to the collector of the transistor Q5. The base electrode of the transistor Q2 is connected to the collector of the transistor Q6. The base of the transistor Q3 is connected to the collector of the transistor Q1. The base of the transistor Q4 is connected to the collector of the transistor Q2. The base of the transistor Q5 is connected to the collector of the transistor Q3. The base of the transistor Q6 is connected to the collector of the transistor Q4. The MOS transistors M1, M2 and M3 together with a fourth MOS transistor M4 constitute a current mirror controlled by $I_{control}$.

As stated previously, the collector resistors of the differential pairs have been replaced by the coils L1, L2, L4, L5, L7 and L8 in the ring oscillator of the invention. Correspondingly, the emitter resistors of the traditional oscillators have been replaced by the coils L3, L6 and L9. Using coils lowers the operating voltage Vcc, because no DC voltage drop at all is generated across them in practice. Thus the potentials occurring at the collectors of the transistors Q1 to Q6 practically are Vcc. The emitter potentials of the transistors Q1 to Q6 consist of the voltage drops occurring across the 0V+MOS transistors M1 to M3. This results in that the operating voltage Vcc can be lowered even to 1.2 V, while the operating voltage of traditional oscillators is about 2 V. Alternatively, an amplitude twice as high as that of the traditional oscillators can be achieved at the same operating voltage.

Since the amplifier stages 31, 32 and 33 in fact are resonance amplifiers, they do not substantially amplify frequencies outside the signal band, such as noise.

The MOS transistors M1, M2, M3 constitute a current mirror together with the MOS transistor M4 connected between the gate electrodes of the transistors M1, M2 and M3 and the potential 0V. Additionally, the bases of the transistors M1 to M4 are connected together and to the frequency control voltage $I_{control}$. This control voltage changes the current flowing through the transistors M1, M2 and M3 and thus also the current flowing through the transistors Q1 to Q6. The currents flowing through the transistors Q1 to Q6 are selected to be as needed for the maximum frequency $f_T$ of the manufacturing process used. The manufacturing process may be e.g. the BiCMOS process. At this current value of Ic or close to it, the transient frequency $f_T$ is nearly constant, which is due to the typically even maximum of the function $f_T(IC)$. If the current through any of the transistors Q1 to Q6 changes, it usually affects electromagnetic processes in the coils L1 to L8 and changes thus the speed of the entire ring oscillator.

In the embodiment of FIG. 3, the outputs from the collectors of the transistors Q1 to Q6 can be brought directly to traditional mixers, for instance.

Figure 4:
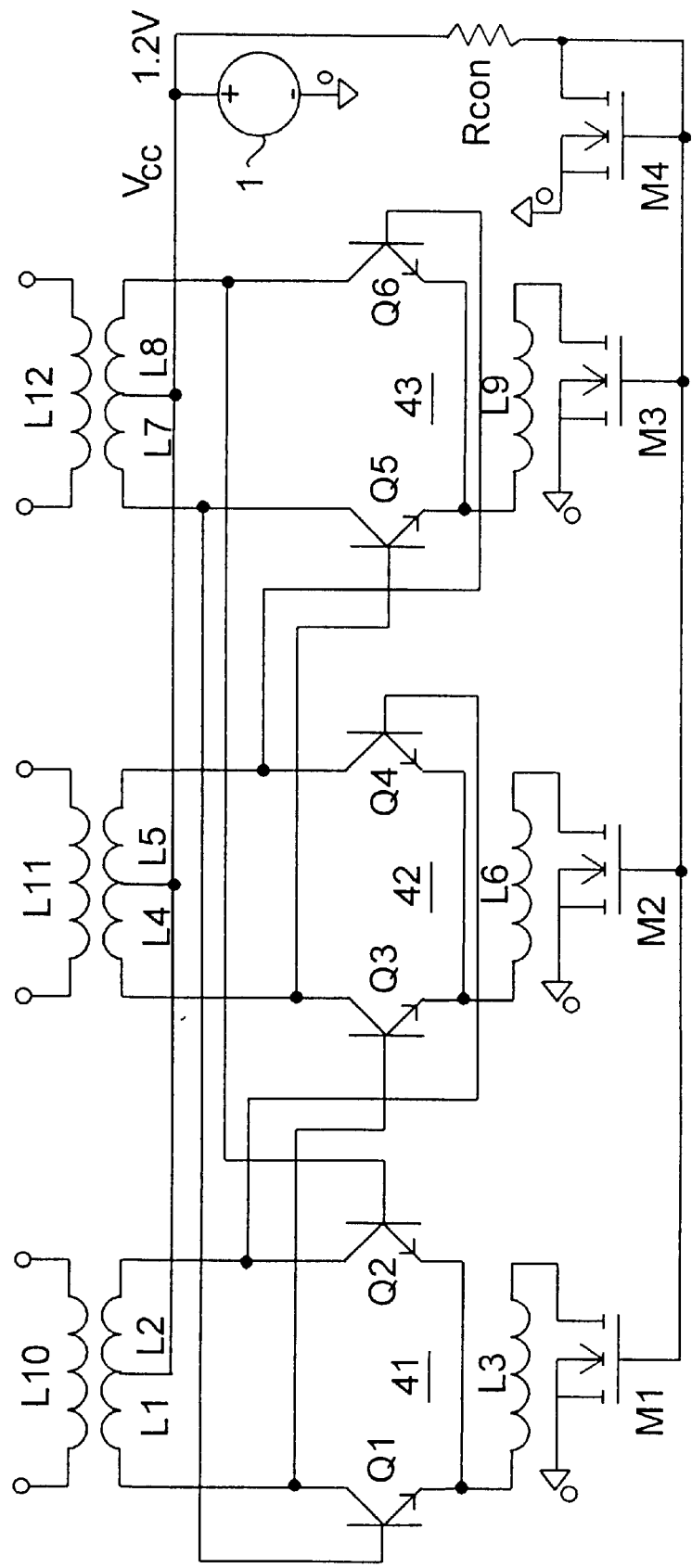
FIG. 4 shows a circuit diagram of another 3-stage ring oscillator according to the invention.

FIG. 4 shows another 3-stage ring oscillator according to the invention. Amplifier stages are indicated by reference numerals 41, 42 and 43. As to the rest, the connection of FIG. 4 is substantially similar to the connection of FIG. 3. The only difference is that the coils L1 and L2 in FIG. 4 are implemented by one coil provided with a tap. One end electrode of the coil L1 is connected to the collector of Q1 and the other end electrode to the collector of Q2. The tap is connected to the operating voltage Vcc. Correspondingly, the coils L4, L5 as well as the coils L7 and L8 consist of coils provided with a tap.

Moreover, the amplifier stage 41 is provided with a coil L10, which is transformer-coupled to receive a signal from the coils L1 and L2 and to sum those signals to generate output signals at their own terminals. L1, L2 and L10 are preferably windings of the same transformer. Thus L1, L2 and L10 act as passive mixers. In the same way, the amplifier stage 42 comprises a coil L11, which is transformer-coupled to the coils L4 and L5. Further, the amplifier stage 43 comprises a coil L12, which is transformer-coupled to the coils L7 and L8.

Figure 5:
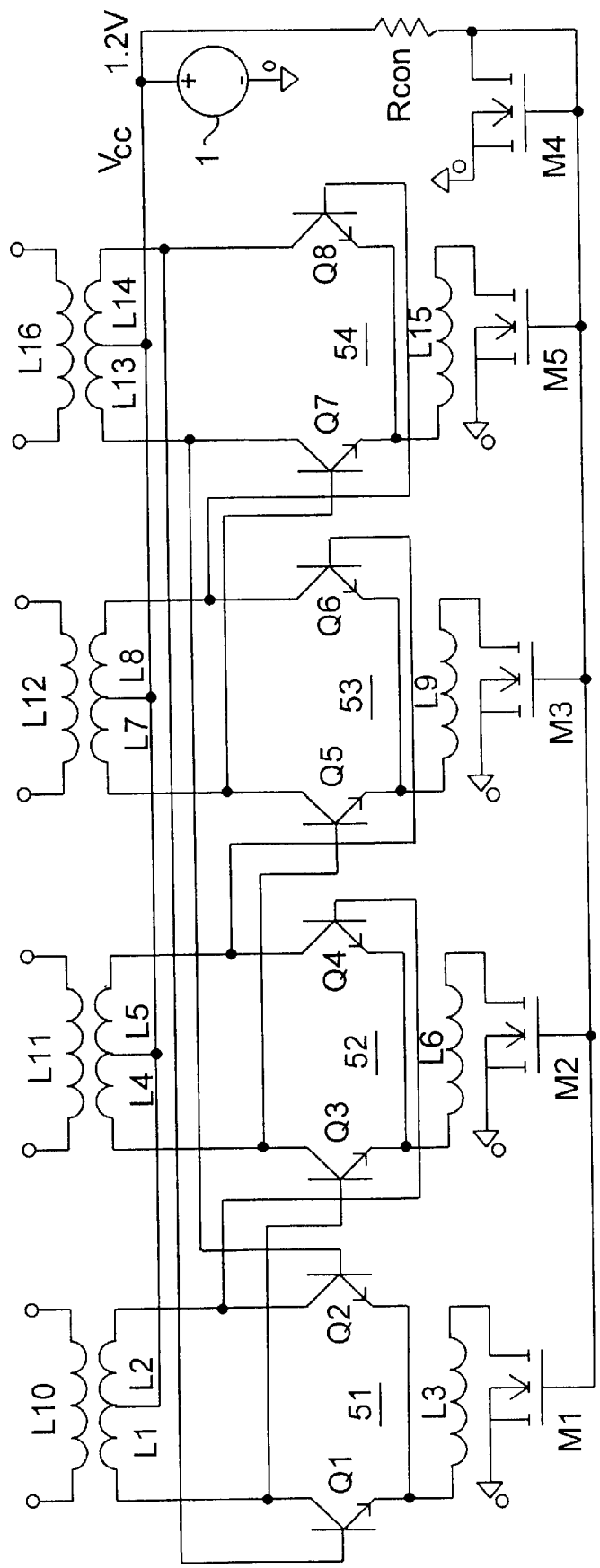
FIG. 5 shows a circuit diagram of a 4-stage ring oscillator according to the invention.

FIG. 5 shows a 4-stage ring oscillator according to the invention. Amplifier stages 51, 52 and 53 are exactly similar to the amplifier stages 41, 42 and 43 in FIG. 4 The amplifier stage 54 comprises a differential pair of transistors Q7 and Q8, the pair comprising collector inductances L13 and L14 implemented by a coil provided with a tap. A coil L16 is transformer-coupled to the coils L13 and L14 to provide a passive mixer. The emitters of the transistors Q7 and Q8 are connected together and via a series connection of a coil L15 and a MOS transistor M5 to the potential 0V. In FIG. 5, the cascade connection of the amplifier stages 51 to 54 is a little different so that quadrature output signals can be generated. To be more exact, the last amplifier stage 54 is connected to the first amplifier stage 51 in an inverted manner compared to the connection between the other stages. More accurately, the collector of the transistor Q7 is connected to the base of the transistor Q2 and the collector of the transistor Q8 to the base of the transistor Q1.

The ring oscillator according to the invention has been analyzed by the 0.8 $\mu$m BiCMOS technology, in which bipolar NPN transistors have the maximum transient frequency $F_{TMAX}=14$ GHz. The current flowing through the transistors is selected in such a way that it provides this transient frequency $F_T$, the current being about 800 $\mu$A when this technology is used. The MOS transistors M1, M2, M3, M4 and M5 used for the current mirrors have a W=1,2 $\mu$m and a W/L=100. The signal shape is between rectangular and sinusoidal and very similar to the typical form in the known ring oscillators. The spectrum of the signal has very significant high harmonics, which can be used in case of FIGS. 3 and 4 for providing a frequency output $3*f_{RING}$ or even $4*f_{RING}$, wherein $3*f_{RING}$ and $4*f_{RING}$ are the third and fourth harmonics, respectively, appearing in the spectrum of the output signal from the ring oscillator, by using passive circuits for mixing, as described above. The control range achieved is about 100 MHz/mA. The oscillator according to the invention may provide e.g. 3*9 GHz and 4*9, wherein 3*9 GHz and 4*9 GHz are the frequencies of the third and fourth harmonics, respectively, when the nominal output frequency $f_{RING}$ is 9 GHz, at an amplitude of 800 mV, consuming only 5.4 mW and 6.2 mW, respectively, from the 1.2 V operating voltage.

The oscillator circuit of the invention is especially suited for modern phase-locked loops (PLL) in communications and microprocessor applications.

The drawings and the related description are intended for an illustration of the invention only. The details of the invention may be modified within the scope and spirit of the appended claims.

We claim:

1. A ring oscillator, comprising a cascade connection of two or more delay stages, each delay stage comprising a differential pair of a first and a second amplifier component, wherein each differential pair comprises a first inductive component, via which a first main electrode of the first amplifier component is connected to a first operating voltage potential, a second inductive component, via which a first main electrode of the second amplifier component is connected to the first operating voltage potential, and a series connection of a third inductive component and a current source between interconnected second main electrodes of the first and second amplifier component and a second operating voltage potential.

2. A ring oscillator according to claim 1, wherein the first, second and third inductive components are coils.

3. A ring oscillator according to claim 2, wherein the first, second and third inductive components are on-chip coils.

4. A ring oscillator according to claim 1, 2 or 3, wherein the first and second inductive components of each differential pair are implemented by one coil provided with a tap.

5. A ring oscillator according to claim 4, wherein said coil comprises a first connecting terminal connected to the first main electrode of the first amplifier component, a second connecting terminal connected to the first main electrode of the second amplifier component and a tap operationally connected to said first operating voltage potential, and the part of the coil being between the first connecting terminal and the tap provides said first inductive component and the part of the coil being between the second connecting terminal and the tap provides said second inductive component.

6. A ring oscillator according to any of the claims 1, 2 or 3, wherein each differential pair comprises a fourth, inductive component creating a transformer connection with said first and second inductive components, while said transformer connection acts as a passive mixer for mixing the outputs of the differential pair with each other in such a way that a mixing output is available between the end terminals of the fourth inductive component.

7. A ring oscillator according to claim 6, wherein the first, second and third inductive components are windings of the transformer.

8. A ring oscillator according to claim 1, wherein the first and second amplifier components are NPN bipolar transistors, in which these first main electrode is a collector, the second main electrode is an emitter and a control electrode is a base, and the control electrodes of the amplifier components constitute inputs of a delay stage.

9. A ring oscillator according to claim 1, wherein the cascade connection comprises at least three delay stages, the last one of which is connected back to the first one, and the first main electrode of the first amplifier component and the second amplifier component, respectively, of each differential pair is connected to a control electrode of the first amplifier component and the second amplifier component, respectively, of the next differential pair.

10. A ring oscillator according to claim 1, wherein the cascade comprises at least three delay stages and the first main electrode of the first amplifier component and the second amplifier component, respectively, of the last differential pair is connected to the control electrode of the second amplifier component and the first amplifier component, respectively, of the first differential pair, and the first main electrode of the first amplifier component and the second amplifier component, respectively, of each other differential pair is connected to the control electrode of the first amplifier component and the second amplifier component, respectively, of the next differential pair.

11. A ring oscillator, comprising a cascade connection of two or more delay stages, each delay stage comprising a differential pair of a first and a second amplifier component, each differential pair comprising, a first inductive component, via which a first main electrode of the first amplifier component is connected to a first operating voltage potential, a second inductive component, via which a first main electrode of the second amplifier component is connected to the first operating voltage potential, and a series connection of a third inductive component and a current source between interconnected second main electrodes of the first and second amplifier components and a second operating voltage potential, the first and second inductive components of each differential pair being implemented by one coil provided with a tap.

12. A ring oscillator, comprising a cascade connection of two or more delay stages, each delay stage comprising a differential pair of a first and a second amplifier component, each differential pair comprising, a first inductive component, via which a first main electrode of the first amplifier component is connected to a first operating voltage potential, a second inductive component, via which a first main electrode of the second amplifier component is connected to the first operating voltage potential, and a series connection of a third inductive component and a current source between interconnected second main electrodes of the first and second amplifier components and a second operating voltage potential, each differential pair comprising a fourth inductance creating a transformer coupling with said first and second inductance, while said transformer coupling acts as a passive mixer for mixing the outputs of the differential pair with each other in such a way that a mixing output is available between the end terminals of the fourth inductance.

\* \* \* \* \*